United States Patent
Sanville, Jr.

(10) Patent No.: US 6,618,238 B2
(45) Date of Patent: *Sep. 9, 2003

(54) PARALLEL PLATE BURIED CAPACITOR

(75) Inventor: Robert J. Sanville, Jr., Laconia, NH (US)

(73) Assignee: Polyclad Laminates, Inc., West Franklin, NH (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/276,370

(22) Filed: Mar. 25, 1999

(65) Prior Publication Data

US 2001/0014004 A1 Aug. 16, 2001

Related U.S. Application Data

(60) Provisional application No. 60/080,250, filed on Apr. 1, 1998.

(51) Int. Cl.$^7$ ............................ H01G 4/08; H01G 4/06
(52) U.S. Cl. ..................... 361/323; 361/313; 361/301.4
(58) Field of Search .......................... 361/301.1, 301.2, 361/301.4, 311–315, 320, 321.1–321.5, 323, 761–765

(56) References Cited

U.S. PATENT DOCUMENTS

| 4,555,745 A | * 11/1985 | Westermeir et al. ........ 361/320 |
| 4,996,097 A | 2/1991 | Fischer ........................ 428/220 |
| 5,120,590 A | 6/1992 | Savage et al. ................. 428/76 |
| 5,162,977 A | * 11/1992 | Paurus et al. ............... 361/762 |
| 5,172,304 A | * 12/1992 | Ozawa et al. ............... 361/763 |
| 5,753,358 A | * 5/1998 | Korleski ................... 428/308.4 |
| 5,785,789 A | 7/1998 | Gagnon et al. ............. 156/235 |
| 5,800,575 A | * 9/1998 | Lucas ......................... 29/25.42 |
| 5,959,256 A | 9/1999 | Saida et al. ................. 174/258 |
| 6,016,598 A | * 1/2000 | Middelman et al. ........ 156/182 |
| 6,021,050 A | * 2/2000 | Ehman et al. .............. 361/793 |

* cited by examiner

Primary Examiner—Dean A. Reichard
Assistant Examiner—Eric Thomas
(74) Attorney, Agent, or Firm—Mintz, Levin, Cohn, Ferris, Glovsky and Popeo, P.C.

(57) ABSTRACT

A novel capacitor foil and printed circuit board intermediate made using that foil are disclosed. The capacitor foil is a three-layer construction having a conductive layer, a partially-cured high dielectric constant layer, and a partially-cured bonding layer. The high dielectric constant and bonding layers are formed with epoxy or other polymer, however, the high dielectric constant layer is loaded with capacitive ceramic particles or pre-fired ceramic forming particles. The bonding layer may or may not be filled with ceramic particles or prefired ceramic-forming particles. The resulting capacitor foil may be applied to a laminate having copper patterns thereon to define a PCB intermediate containing at least one buried capacitor device. Multiple layers of capacitance material also can be used to increase the overall capacitance of the board.

10 Claims, 1 Drawing Sheet

PARALLEL PLATE BURIED CAPACITOR

PRIOR APPLICATION

The present application is based on Provisional Patent Application Serial No. 60/080,250, which was filed on Apr. 1, 1998 having the same title, and which is incorporated by reference herein.

FIELD OF THE INVENTION

The present invention relates generally to printed circuit boards and printed wiring boards for use in the electronics industry. More specifically, the present invention relates to a printed circuit board having at least one embedded capacitor. In one application, such capacitors may be used as decoupling capacitors for integrated circuits installed on the printed circuit board.

BACKGROUND

The electronics industry currently makes wide use of printed circuit and printed wiring boards (hereafter, collectively referred to as "printed circuit boards" or "PCBs"). Typical printed circuit boards can include multiple composite layers formed from organic and inorganic materials and include both internal and external wiring. The boards allow electrical components to be mechanically supported and electrically connected among one another. As electronic technology advances, the trend is toward placing increasing numbers of interconnect layers, greater pass-through hole densities (permitted by small hole diameters), and finer line (trace) widths on the boards. Each of these is intended to allow a greater number of devices to be installed on a printed circuit board having a given size.

Despite the development of printed circuit boards which allow greater device densities, little progress has been made regarding the ability to build active or passive electronic devices as integrated elements during manufacture of a multi-layer printed circuit board. This is a result of numerous problems that are associated with device and board integration. For example, printed circuit board manufacturing processes and circuit manufacturing processes are substantially incompatible with regard to the required degree of cleanliness, thermal cycling, photolithography and other requirements.

In applications in which a printed circuit board is intended to carry a large number of integrated circuit devices, a correspondingly large number of decoupling capacitors is required. The decoupling capacitors provide instantaneous current requirements for the integrated circuits and also serve to reduce system noise. Unfortunately, the numerous decoupling capacitors can occupy considerable printed circuit board surface area, and at the same time require extra assembly of the overall device in that they must be positioned on and affixed to the printed circuit board. As a result, the requirement for decoupling capacitors adds significantly to the overall cost of manufacture of electronic devices.

Recently, methods for burying a capacitor within the circuit board have been developed. Of these methods, two are currently acceptable from a practical commercial standpoint. The first method uses a thin, substantially copper clad, epoxy-impregnated fiberglass laminate as a parallel plate capacitor. Although the overall dielectric constant of the composite material, (i.e. the fiberglass laminate), is relatively low, (approximately 4.5), the capacitance is still high enough to be effective in some cases. This is particularly true when the laminate used is relatively thin, (i.e., on the order of approximately 0.002 inches). The second method for burying a capacitor within a circuit board involves the application of a filled epoxy containing a high percentage of ceramic filler or pre-fired ceramic forming materials to a roll of copper foil. (As used herein, the term "ceramic filler" is intended to encompass pre-fired ceramic forming materials as well as ceramic fillers). The roll can then be cut into sheets, positioned in a face-to-face relationship with the filled epoxy surfaces contacting each other, and then exposed to elevated temperatures and pressures to form a laminate. The overall capacitance of this type of buried capacitor is approximately four times that of the epoxy-fiberglass parallel plate type described above. This is a result of the presence of the ceramic which imparts a high dielectric constant to the laminate body. Unfortunately, however, this method produces a laminate that is approximately 4–5 mils thick because each of the sheets used is approximately 2.5 mils thick and two such sheets must be pressed together in order to achieve the proper bond strength. Likewise, the overall strength requirements of the laminate lead to such thicknesses in order to produce a structure that is sufficiently strong to be processed using standard printed circuit board fabrication methods.

Thus, it should be apparent that a need exists for a simple, low cost method of providing a low-profile integrated (i.e., buried) capacitor in a printed circuit board, and a need also exists for integrated capacitors which have a capacitance that exceeds the capabilities of buried capacitors currently known in the art.

SUMMARY OF THE INVENTION

The present invention relates generally to printed circuit boards having one or more integrated or buried capacitors. More particularly, the present invention relates to a capacitor foil for use in forming buried parallel plate capacitors on a printed circuit board intermediate. The capacitor foil includes a conductive layer, a relatively high dielectric constant layer, and a bonding layer. The bonding layer may or may not have a dielectric constant that is lower than that of the layer applied to the copper. The conductive layer may be used to define the power plane of a capacitor and the dielectric and bonding layers may be used to define the dielectric layers of a capacitor. Each of the dielectric and bonding layers are formed of an epoxy or other polymer resin system typically used in the printed circuit board industry, (i.e., polyimides, Bismaleimide triazines, cyanate esters, etc.), however, the dielectric layer is filled with ceramic particles or pre-fired ceramic forming particles, whereas the polymer resin comprising the bonding layer can be unfilled, less highly filled, or as highly filled but relatively uncured. It is noted that the term "dielectric layer" as used throughout the specification herein is intended to describe a layer of material having a relatively high dielectric constant.

In use, the capacitor film may be applied to the surface of a laminate which contains numerous copper patterns, each defining, for example, a ground plane of a discrete capacitor, and becoming an inner layer once the capacitor film is in place. By laminating the capacitor foil over the patterned inner layer, a PCB intermediate having a multiplicity of buried capacitors can be formed. Alternatively, if the patterned inner layer is such that there is one solid, contiguous sheet of copper, one large capacitor is formed. If such a single, large capacitor is formed, the capacitance can be shared among all parts of the board. The intermediate may subsequently be processed using any of a wide variety of PCB processing steps in order to fabricate an electronic device based upon a PCB having internal capacitance.

DETAILED DESCRIPTION

The present invention relates to a novel material for use in forming buried parallel plate capacitors as well as to a process for forming such capacitors. In addition, the present invention relates to a printed circuit board intermediate which incorporates at least one buried parallel plate capacitor.

The parallel plate capacitors of the present invention are made using a copper foil having a multi-layer epoxy or other polymer resin structure formed on one surface thereof. In particular, a copper foil is provided upon which is coated a filled resin. The resin is filled with high dielectric particles, typically ceramic, described in detail below, which provide it with enhanced dielectric properties. A second, unfilled or less filled polymer resin is coated upon the filled resin layer. The resulting structure, hereafter termed a "capacitor foil", is a three layer body having a copper surface, a resin bonding surface, and a filled, high dielectric constant, particle loaded, resin sandwiched therebetween.

Figure 1:
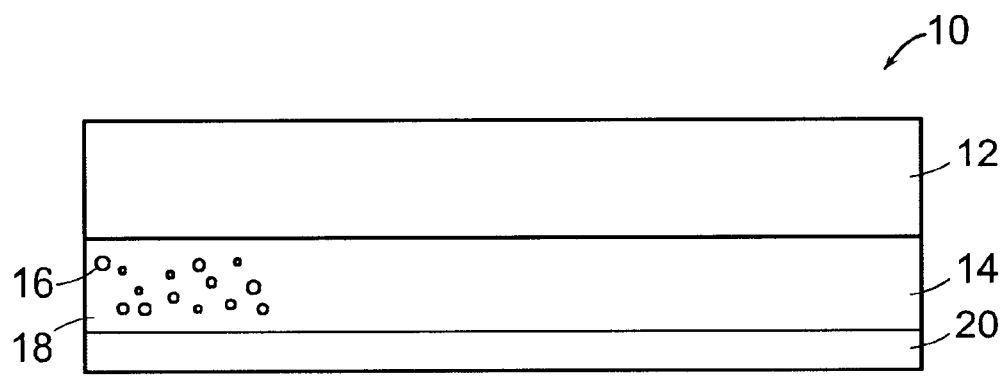
FIG. 1 is an elevational view of one embodiment of a capacitor foil of the present invention.

One embodiment of the capacitor foil may be seen in FIG. 1. Specifically, FIG. 1 shows a capacitor foil 10 which includes a conductive layer 12 of a copper foil, a dielectric layer 14 of a ceramic-filled resin, and a bonding layer 20, typically of unfilled, lightly filled polymer resin, or filled, relatively uncured resin. In one embodiment, the ceramic-filled resin which forms the dielectric layer 14 includes numerous ceramic particles 16 encapsulated within a surrounding epoxy matrix 18. The dielectric layer 14 may have a thickness in the range of about 0.0005 inches to about 0.003 inches, but more preferably, it has a thickness in the range of about 0.001 inches to about 0.002 inches before pressing. The bonding layer 20 typically has a thickness on the order of about 0.0005–0.001 inches. The copper forming the conductive layer 12 typically has a thickness on the order of about 9 micrometers to about 360 micrometers The high dielectric, filled resin used in the dielectric layer 14 may be an epoxy resin selected from among any of a wide variety of epoxies known in the art. A Bisphenol A epoxy (such as Shell 828 Bisphenol A epoxy) is used in one preferred embodiment. The filler material can be a ceramic powder, such as Y5V ceramic capacitor formulation, commercially available from Tam Ceramics, Niagara Falls, N.Y. In a typical application, the filler 16 comprises approximately 30–70% of the ceramic-filled epoxy by volume and approximately 60–97% of the ceramic-filled epoxy by weight. In one preferred embodiment, the filler 16 comprises approximately 50% of the ceramic-filled epoxy by volume and approximately 95% of the ceramic-filled epoxy by weight. As pointed out above, however, the invention is not intended to be limited to epoxy resin systems. Rather, any of a wide variety of polymer resins may be used to form the dielectric layer 14.

The unfilled, lightly filled, or filled, relatively uncured resin which forms the bonding layer 20 may also be any of a wide variety of epoxies known in the art. In one preferred embodiment, a highly brominated epoxy such as high brominated epoxy commercially available from Dow Chemical, Midland, Mich. under the trade name 71920.03 may be used, as well as DER 592 or DER 542, also available from Dow, or Epon 1163, for example, commercially available from Shell Chemical. Again, however, the invention is not intended to be limited to epoxy resin systems. Rather, any of a wide variety of polymer resins may be used to form the bonding layer 20.

Although it is not required that the bonding layer 20 and the dielectric layer 14 employ different resin compositions, the resin formulation used in the dielectric layer 14 is typically different than that used in the bonding layer 20 due to the specific physical property requirements of the differing layers. Thus, in the filled layer, it is desirable to use a resin that is amenable to a high degree of loading with ceramic particles or pre-fired ceramic forming particles, whereas loading and filling considerations are not required in the case in which the bonding layer 20 employs an unfilled resin.

Parallel plate capacitance, in general, can be determined by the equation:

$$C = \kappa A \epsilon / d$$

where C represents the capacitance of the capacitor, $\kappa$ represents the dielectric constant of the substance, A represents the area of the capacitor, $\epsilon$ represents the permittivity of free space, and d represents the distance between the two plates. Thus, by increasing the dielectric constant of the dielectric layer 14 and/or the bonding layer 20 through the use of ceramic filler 16, or by using polymer resin systems having an inherently high dielectric constant, and by decreasing the distance between the plates through the use of a thin construction, the capacitance of the resulting device can be substantially increased.

In the device shown in FIG. 1, after the high dielectric constant layer 14 is coated onto the copper conductive layer 12, it is partially cured. The partial curing provides a means of regulating the total thickness and uniformity of thickness of the dielectric layer, and allows a strong chemical bond to be formed between it and the bonding layer 20. Curing is typically carried out under the following conditions: 300–400° F. (149–204° C.) in a multiple zone oven. The first zone usually has a lower temperature and is used to drive off solvent. Subsequent zones are used to cure the polymer. Oven dwell time is typically about 2–5 minutes depending on the length of the zones and the reactivity of the particular resin formula being cured. Following curing of the dielectric layer 14, the bonding layer 20 is formed by coating the unfilled, lightly filled or filled relatively uncured resin onto the exposed surface of the dielectric layer. Once the bonding polymer layer has been applied, it is partially cured under similar conditions as the filled polymer except that the oven dwell time is typically shorter, (i.e., on the order of 0.5–5 minutes for the epoxies described herein). This allows for both a good chemical bond and decreased thickness upon pressing, because most of the polymer flows out of the laminate. The resulting structure is particularly useful in the fabrication of a buried parallel plate capacitor in the manner described below.

In use, a segment or section of a standard PCB inner layer having a copper coating or layer on one surface thereof is provided. The inner layer dielectric material is any of a wide variety of such materials known in the art of PCB fabrication. The copper conductive layer can ultimately act as the power or ground plane in the PCB. The copper layer on the surface of the board is patterned, using any of a variety of well-known processing techniques in order to define desired capacitive areas on the surface of the board, and clearances for routing. Subsequently, a sheet of capacitor foil 10 of the type shown in FIG. 1 is adhered and laminated to the patterned board. Any of a wide variety of well-known lamination procedures may be used to achieve this lamination step, such as curing in a press at about 150–350 psi for about 30–120 minutes for epoxy. Other polymer systems will require press cycles tailored to their own individual needs. It is noted that during this lamination, a substantial portion of the unfilled, lightly filled or filled relatively uncured resin that forms the bonding layer is squeezed out to the edges of the capacitor foil and removed and/or fills open areas within the inner layer. As such, the application of the capacitor foil to the surface of the PCB increases the board thickness by a degree on the order of the thickness of the conductive layer and the dielectric layer. The thickness of the unfilled polymer is minimized following lamination.

Figure 2:
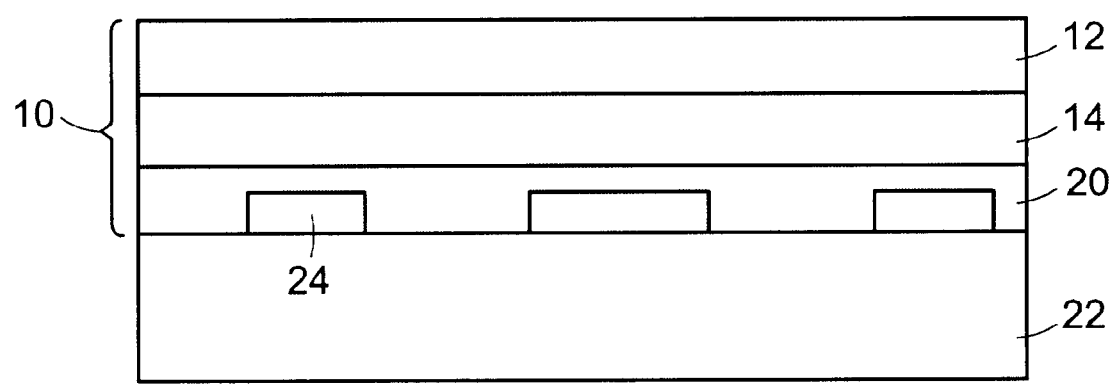
FIG. 2 is an elevational view of one embodiment of a PCB intermediate of the present invention.

A printed circuit board product in the form of an intermediate for use in further processing is shown in FIG. 2. As can be seen in FIG. 2, the capacitor foil 10 of the present invention has been applied to the surface of a laminate 22 upon which are patterns 24 of copper. More particularly, the intermediate PCB includes the capacitor foil 10 having a conductive layer 12, a dielectric layer 14, and a very thin bonding layer 20 applied to the surface of a patterned PCB. Capacitors are created in the regions of the copper patterns 24 that have been formed on the laminate 22. Thus, each patterned region 24 can serve as a capacitor ground plane, while the dielectric layer 14 and the conductive layer 12 above it define the remaining parts of the capacitor. Thus, when a copper area 24 is used as a ground plane, the conductive layer 12 separated from the ground plane by the dielectric layer 14 constitutes a power plane for the capacitor.

It should be noted that although the device depicted in FIG. 2 may include a large multiplicity of various capacitors, its appearance is very similar to that of a laminate having a copper layer deposited on its surface. This intermediate PCB may be further processed to pattern the conductive layer 12, to provide additional layers, or to take advantage of any of the other processing steps commonly associated with PCB manufacture. Thus, the resulting product will be substantially the same as known PCBs, with the exception that the completed unit will include at least one capacitor buried within its multi-layered construction.

The resulting capacitor-containing PCB intermediate has typical thicknesses ranging from about 0.008–0.05 inches (0.020–0.127 cm). Such structures are unique in that they allow the fabrication of completed PCBs containing numerous effective capacitors, without the disadvantage of undue thickness. As such, the capacitor foil and PCB intermediates of the present invention provide the device fabricator with the ability to use a PCB of a substantially smaller size since there is no need to apply numerous external capacitors thereto.

Equivalents

From the foregoing detailed description of the specific embodiments of the invention, it should be apparent that a unique capacitor foil and capacitor-containing PCB, as well as methods of manufacture of such devices, has been described. Although particular embodiments have been disclosed herein in detail, this has been done by way of example for purposes of illustration only, and is not intended to be limiting with respect to the scope of protection to which the applicants may be entitled. In particular, it is contemplated by the inventors that various substitutions, alterations, and modifications may be made to the invention without departing from the spirit and scope of the invention.

What is claimed is:

1. An intermediate capacitor foil which comprises a multi-layered body having:
   a) a conductive copper foil having an exposed surface;
   b) a bonding layer comprising a polymeric layer and having a thickness in the range of from about 0.0005 to about 0.001 inches, and having an unbonded surface; and
   c) a partially-cured, filled, epoxy resin joined to and between (a) the conductive copper foil at a surface opposite the exposed surface and (b) the bonding layer at a surface opposite the unbonded surface, the resin being loaded with a filler comprising ceramic particles having a high dielectric constant, wherein the filled resin forms a dielectric layer having a thickness in the range of about 0.0005 to about 0.003 inches,
   wherein the bonding layer is:
      unfilled;
      less-highly filled than the partially-cured, filled epoxy resin; or
      relatively uncured.

2. An intermediate capacitor foil as in claim 1, wherein the bonding layer comprises a polymeric resin selected from the group consisting of unfilled polymeric resins; lightly-filled polymeric resins; and filled, relatively-uncured polymeric resins.

3. An intermediate capacitor foil as in claim 2, wherein the polymeric resin comprises an epoxy resin.

4. An intermediate capacitor foil as in claim 1, wherein the epoxy resin comprises a bisphenol A epoxy resin.

5. An intermediate capacitor foil as in claim 1, wherein the ceramic particles comprise between about 30% and about 70% by volume of the filled epoxy resin.

6. A printed circuit board intermediate which comprises:
   a) a substrate laminate;
   b) a conductive pattern formed upon one surface of the substrate laminate; and
   c) a capacitor foil applied upon at least a portion of the conductive pattern, the capacitor foil comprising:
      i) a conductive copper foil having an exposed surface;
      ii) a bonding layer adhered to the portion of the conductive pattern, said bonding layer comprising a polymeric layer and having a thickness in the range of from about 0.0005 to about 0.001 inches; and
      iii) a partially-cured, filled, epoxy resin joined to and between (a) the conductive copper foil at a surface opposite the exposed surface and (b) the bonding layer, the resin being loaded with a filler comprising ceramic particles having a high dielectric constant, wherein the filled resin forms a dielectric layer having a thickness in the range of about 0.0005 to about 0.003 inches
      wherein the bonding layer is:
         unfilled;
         less-highly filled than the partially-cured, filled epoxy resin; or
         relatively uncured.

7. A printed circuit board intermediate as in claim 6, wherein the bonding layer comprises a polymeric resin selected from the group consisting of unfilled polymeric resins; lightly-filled polymeric resins; and filled, relatively-uncured polymeric resins.

8. A printed circuit board intermediate as in claim 7, wherein the polymeric resin comprises an epoxy resin.

9. A printed circuit board intermediate as in claim 6, wherein the epoxy resin comprises a bisphenol A epoxy resin.

10. A printed circuit board intermediate as in claim 6, wherein the ceramic particles comprise between about 30% and about 70% by volume of the filled epoxy resin.

* * * * *